(12) United States Patent
Wang et al.

(10) Patent No.: US 12,527,204 B2
(45) Date of Patent: Jan. 13, 2026

(54) TERMINAL APPARATUS, DISPLAY PANEL WITH LIGHT-SHIELDING BODY FILLED IN MOUNTING HOLE, AND MANUFACTURING METHOD THEREOF

(71) Applicant: BOE Technology Group Co., Ltd., Beijing (CN)

(72) Inventors: Haoran Wang, Beijing (CN); Ziyu Zhang, Beijing (CN); Chunyan Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 599 days.

(21) Appl. No.: 17/914,835

(22) PCT Filed: May 27, 2021

(86) PCT No.: PCT/CN2021/096549
§ 371 (c)(1),
(2) Date: Sep. 27, 2022

(87) PCT Pub. No.: WO2022/246768
PCT Pub. Date: Dec. 1, 2022

(65) Prior Publication Data
US 2024/0324421 A1    Sep. 26, 2024

(51) Int. Cl.
*H10K 59/80*     (2023.01)
*H10K 59/65*     (2023.01)

(52) U.S. Cl.
CPC ........... *H10K 59/871* (2023.02); *H10K 59/65* (2023.02); *H10K 59/8722* (2023.02);
(Continued)

(58) Field of Classification Search
CPC .. H10K 59/65; H10K 59/871; H10K 59/8722; H10K 59/8792; H10K 59/8794; H10K 59/873
See application file for complete search history.

(56) References Cited

U.S. PATENT DOCUMENTS

2023/0217703 A1*    7/2023    Lee ................... H10K 50/80
                                                                257/680

FOREIGN PATENT DOCUMENTS

| CN | 108873429 A | 11/2018 |
|---|---|---|
| CN | 108983469 A | 12/2018 |

(Continued)

OTHER PUBLICATIONS

Improved translation of CN-210836877-U, published 2020.*
(Continued)

*Primary Examiner* — Suberr L Chi
(74) *Attorney, Agent, or Firm* — XSENSUS LLP

(57) ABSTRACT

A display panel includes a display substrate having a display region and a peripheral region located outside the display region; a cover plate on a side of the display substrate; a first protective layer on a side of the display substrate facing away from the cover plate, and covering at least the display region; a mounting hole extending at least from a surface of the first protective layer facing away from the display substrate to the cover plate, and penetrating through at least the first protective layer and the display substrate; wherein the mounting hole penetrates through at least part of the display region; and a light-shielding body filled in the mounting hole, and provided with a light-transmitting hole which penetrates through the light-shielding body in an axial direction of the mounting hole.

15 Claims, 8 Drawing Sheets

(52) U.S. Cl.
CPC ..... *H10K 59/8792* (2023.02); *H10K 59/8794* (2023.02); *H10K 59/873* (2023.02)

(56) References Cited

FOREIGN PATENT DOCUMENTS

| | | | |
|---|---|---|---|
| CN | 109031756 | A | 12/2018 |
| CN | 110426878 | A | 11/2019 |
| CN | 209707866 | U | 11/2019 |
| CN | 108873429 | B | 5/2020 |
| CN | 210836877 | U * | 6/2020 |
| CN | 111443774 | A | 7/2020 |
| CN | 112904614 | A | 6/2021 |
| CN | 108983469 | B | 12/2021 |
| JP | 2003-167241 | A | 6/2003 |
| JP | 2014-153483 | A | 8/2014 |
| WO | 2020/007139 | A1 | 1/2020 |

OTHER PUBLICATIONS

International Search Report and Written Opinion issued Jan. 28, 2022, issued in International Application No. PCT/CN2021/096549, 9 PP.

\* cited by examiner

TERMINAL APPARATUS, DISPLAY PANEL WITH LIGHT-SHIELDING BODY FILLED IN MOUNTING HOLE, AND MANUFACTURING METHOD THEREOF

CROSS REFERENCE

The present application is the U.S. national phase application of PCT Application No. PCT/CN2021/096549, filed on May 27, 2021, and the entire contents thereof are incorporated herein by reference.

TECHNICAL FIELD

The present disclosure relates to the technical field of display, and specifically, to a terminal apparatus, a display panel, and a manufacturing method of the display panel.

BACKGROUND

In electronic apparatuses such as mobile phones and tablet computers, an opening is often provided in a display region, and a photoelectric sensing device is disposed at the opening. The external light may reach the photoelectric sensing device through the opening and an image may be generated. The photoelectric sensing device may be a camera or a sensor for fingerprint identification. However, the opening may occupy a local region of the display region and images cannot be displayed, resulting in a small effective display region, and the imaging quality of the photoelectric sensing device still needs to be improved.

It should be noted that the information disclosed in the above Background Art is only for enhancement of understanding of the background of the present disclosure, and thus it may contain information that does not form the prior art that is already known to a person of ordinary skill in the art.

SUMMARY

The purpose of the present disclosure is to provide a terminal apparatus, a display panel and a method for manufacturing the same.

According to an aspect of the present disclosure, there is provided a display panel, comprising:
  a display substrate having a display region and a peripheral region located outside the display region;
  a cover plate disposed on a side of the display substrate;
  a first protective layer disposed on a side of the display substrate facing away from the cover plate, and covering at least the display region;
  a mounting hole extending at least from a surface of the first protective layer facing away from the display substrate to the cover plate, and penetrating through at least the first protective layer and the display substrate; wherein the mounting hole penetrates through at least part of the display region; and
  a light-shielding body filled in the mounting hole, and provided with a light-transmitting hole which penetrates through the light-shielding body along an axial direction of the mounting hole.

In an exemplary embodiment of the present disclosure, the mounting hole comprises a first hole segment and a second hole segment arranged in a direction close to the cover plate, the first hole segment penetrates through the first protective layer, and the second hole segment penetrates through the display substrate; sidewalls of the first hole segment surround outside the second hole segment;

Wherein the light-shielding body comprises a first light-shielding portion and a second light-shielding portion arranged in a direction close to the cover plate, the first light-shielding portion is filled in the first hole segment, and the second light-shielding portion is filled in the second hole segment; the light-transmitting hole penetrates through the first light-shielding portion and the second light-shielding portion.

In an exemplary embodiment of the present disclosure, an orthographic projection of a sidewall of the light-transmitting hole located in a region of the first light-shielding portion and an orthographic projection of a sidewall of the light-transmitting hole located in a region of the second light-shielding portion on the cover plate overlap.

In an exemplary embodiment of the present disclosure, a distance between the sidewall of the light-transmitting hole and the sidewall of the mounting hole is not less than 1 μm and not more than 500 μm.

In an exemplary embodiment of the present disclosure, the display substrate comprises:
  a driving backplane; and
  a light-emitting layer disposed on a side of the driving backplane close to the cover plate; the light-emitting layer comprises a plurality of light-emitting devices located in the display region, and any one of the light-emitting devices and the mounting holes are alternatively disposed in the region of the light-emitting layer.

In an exemplary embodiment of the present disclosure, a distance between the light-emitting device closest to a region of the light-emitting layer where the sidewall of the mounting hole is located and a region of the light-emitting layer where the sidewall of the mounting hole is located is more than 0 and less than 0.3 mm.

In an exemplary embodiment of the present disclosure, the display panel further comprises:
  a first adhesive layer adhered to a surface of the display substrate facing away from the cover plate; the first protective layer is adhered to a surface of the first adhesive layer facing away from the display substrate;
  Wherein the mounting hole and the light-transmitting hole penetrate through the first adhesive layer.

In an exemplary embodiment of the present disclosure, the display panel further comprises:
  a second adhesive layer adhered to a surface of the display substrate facing away from the first protective layer; and
  an intermediate functional layer adhered to a surface of the second adhesive layer facing away from the first protective layer; the intermediate functional layer comprises a polarizer.

The mounting hole and the light-transmitting hole penetrate through the second adhesive layer and the intermediate functional layer.

In an exemplary embodiment of the present disclosure, the display panel further comprises:
  a third adhesive layer adhered to a surface of the intermediate functional layer facing away from the display substrate;
  Wherein cover plate is adhered to a surface of the third adhesive layer facing away from the display substrate.

In an exemplary embodiment of the present disclosure, the mounting hole and the light-transmitting hole penetrate through the third adhesive layer and expose the cover plate.

In an exemplary embodiment of the present disclosure, the mounting hole and the light-transmitting hole expose the third adhesive layer.

In an exemplary embodiment of the present disclosure, the display panel further comprises:

a second protective layer disposed on a side of the first protective layer facing away from the display substrate, and comprising a buffer layer and a heat dissipation layer arranged in a direction facing away from the display substrate;

Wherein mounting hole further comprises a third hole segment penetrating through the second protective layer, and sidewalls of the third hole segment surround outside the first hole segment;

Wherein the light-shielding body further comprises a third light-shielding portion, the third light-shielding portion is filled in the third hole segment, and the light-transmitting hole penetrates through the third light-shielding portion; an orthographic projection of a sidewall of the light-transmitting hole located in a region of the third light-shielding portion and an orthographic projection of a sidewall of the light-transmitting hole located in a region of the first light-shielding portion on the cover plate overlap.

According to an aspect of the present disclosure, there is provided a method for manufacturing a display panel, comprising:

forming a display substrate having a display region and a peripheral region, and the peripheral region being located outside the display region;

forming a first protective layer having a first hole segment;

forming a first adhesive layer on a side of the display substrate;

adhering the first protective layer to a surface of the first adhesive layer facing away from the display substrate; exposing, by the first hole segment, a part of the display region;

forming a second adhesive layer on a surface of the display substrate facing away from the first protective layer;

adhering an intermediate functional layer to a surface of the second adhesive layer facing away from the display substrate;

forming a release layer on a surface of the intermediate functional layer facing away from the display substrate;

opening a second hole segment in communication with the first hole segment in the display substrate along the first hole segment to form a mounting hole, and the second hole segment penetrating through the release layer;

removing the release layer;

forming a support layer on a surface of the second adhesive layer facing away from the display substrate, and the second hole segment exposing the support layer;

filling a light-shielding body in contact with the support layer in the mounting hole;

opening a light-transmitting hole in the light-shielding body to form a first light-shielding portion and a second light-shielding portion arranged in a direction close to the support layer, the first light-shielding portion being filled in the first hole segment, and the second light-shielding portion being filled in the second hole segment; the light-transmitting hole penetrating through the first light-shielding portion, the second light-shielding portion and the support layer;

removing the support layer;

forming a third adhesive layer on a surface of the intermediate functional layer facing away from the display substrate; and adhering a cover plate to a surface of the third adhesive layer facing away from the display substrate.

According to an aspect of the present disclosure, there is provided a method for manufacturing a display panel, comprising:

forming a display substrate having a display region and a peripheral region, and the peripheral region being located outside the display region;

forming a first protective layer having a first hole segment;

forming a first adhesive layer on a side of the display substrate;

adhering the first protective layer to a surface of the first adhesive layer facing away from the display substrate; exposing, by the first hole segment, part of the display region;

forming a second adhesive layer on a surface of the display substrate facing away from the first protective layer;

adhering an intermediate functional layer to a surface of the second adhesive layer facing away from the display substrate;

forming a third adhesive layer on a surface of the intermediate functional layer facing away from the display substrate;

adhering a release layer to a surface of the third adhesive layer facing away from the display substrate;

opening a second hole segment in communication with the first hole segment in the display substrate along the first hole segment to form a mounting hole, and the second hole segment penetrating through the release layer;

forming a support layer on a surface of the release layer facing away from the display substrate, and the second hole segment exposing the support layer;

filling a light-shielding body in contact with the support layer in the mounting hole;

opening a light-transmitting hole in the light-shielding body to form a first light-shielding portion and a second light-shielding portion arranged in a direction close to the support layer, the first light-shielding portion being filled in the first hole segment, and the second light-shielding portion being filled in the second hole segment; the light-transmitting hole penetrating through the first light-shielding portion, the second light-shielding portion and the support layer;

removing the support layer and the release layer; and adhering a cover plate to a surface of the third adhesive layer facing away from the display substrate.

According to an aspect of the present disclosure, there is provided a terminal apparatus, comprising:

the display panel of any one of the above described; and a photoelectric sensing device disposed on a side of the first protective layer facing away from the cover plate at a position facing to the light-transmitting hole, and configured to receive light passing through the light-transmitting hole.

It should be understood that the foregoing general description and the following detailed description are exemplary and illustrative only and do not intend to limit the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the accompanying drawings in the following description are only some embodiments of the present disclosure, and other accompanying drawings may also be obtained from them without creative effort for those skilled in the art.

Figure 1:
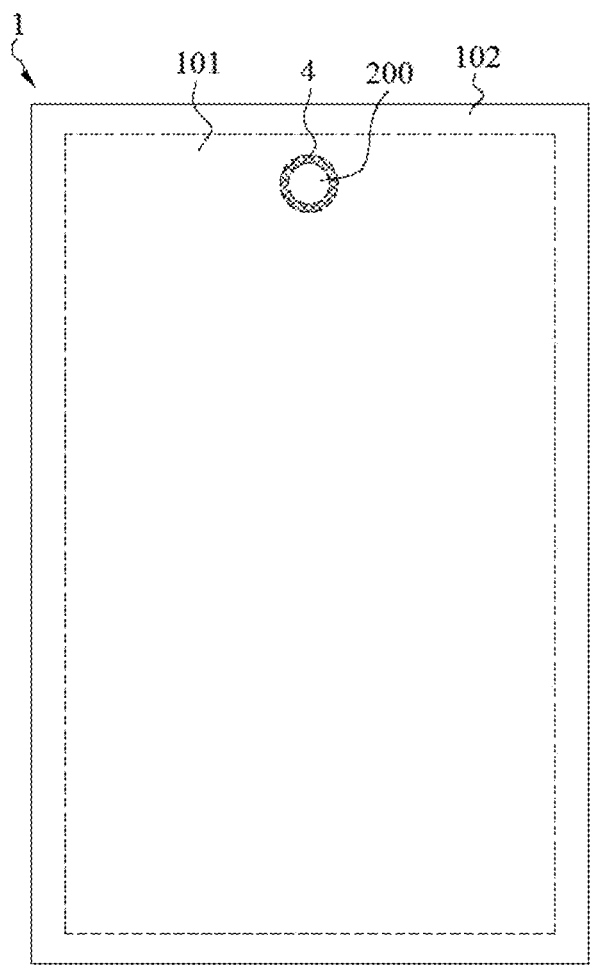
FIG. 1 is a schematic diagram of a display substrate, a light-shielding body and a light-transmitting hole in an embodiment of a display panel according to the present disclosure.

Reference numerals are presented as follows:

1. display substrate; 101. display region; 102. peripheral region; 110. driving backplane; 120. light-emitting layer; 121. first electrode; 122. pixel defining layer; 1221. opening; 123. light-emitting functional layer; 124. second electrode; 130. encapsulation layer;
2. cover plate;
3. first protective layer;
4. light-shielding body; 41. first light-shielding portion; 42. second light-shielding portion; 43. third light-shielding portion;
5. intermediate functional layer;
6. first adhesive layer;
7. second adhesive layer;
8. third adhesive layer;
9. release layer;
10. support layer;
11. second protective layer;
100. mounting hole; 1001. first hole segment; 1002. second hole segment; 1003. third hole segment; 200. light-transmitting hole;
001. display panel; 002. photoelectric sensing device.

DETAILED DESCRIPTION

Example embodiments will now be described more fully with reference to the accompanying drawings. Example embodiments, however, can be embodied in various forms and should not be construed as limited to the embodiments set forth herein; on the contrary, these embodiments are provided so that the present disclosure will be comprehensive and complete, and will fully convey the concept of example embodiments to those skilled in the art. The same reference numerals in the drawings indicate the same or similar structures, and thus detailed description thereof will be omitted. In addition, the accompanying drawings are merely schematic illustrations of the present disclosure and are not necessarily drawn to scale.

The terms "a", "an", "the", "said", and "at least one" are used herein to indicate the presence of one or more elements/components/etc. The terms "comprise" and "have" are used herein to indicate an open-ended inclusion and mean that additional elements/components/etc. may be present in addition to the listed elements/components/etc. The terms "first", "second" and "third", etc. are used only as labels and are not intended to limit the number of the objects thereof.

In related art, a display panel has a display region and a peripheral region located outside the display region. The display region has a plurality of light-emitting devices which may emit light to a side of the display panel to display images, and a side from which light is emitted is a light-outgoing side. A photoelectric sensing device may be disposed on a backlight side of the display panel, which is opposite to the light-outgoing side. The display region may be provided with an opening, and the photoelectric sensing device disposed opposite to the opening may receive light from the light-outgoing side to the backlight side through the opening, so as to form an image. The photoelectric sensing device may be a camera, and accordingly, the camera may capture images through the opening. The photoelectric sensing device may also be a sensor for fingerprint identification, so as to receive light reflected by fingerprints through the opening and to form a fingerprint image for fingerprint identification.

When capturing an image or performing fingerprint identification, it needs to increase a distance between the light-emitting device and the opening to prevent the light emitted by the light-emitting device from reaching the photoelectric sensing device through the opening directly and thus resulting in interference with the accuracy of an image generated by the photoelectric sensing device. The distance is generally more than 0.5 mm, that is, there is a non-light-emitting region between the light-emitting region and the opening, so that it cannot emit light not only at the opening, but also at a certain range around the opening, resulting in a reduction of an effective display area, and part of the light emitted by the light-emitting device closer to the opening may still directly reach the photoelectric sensing device through the opening. In addition, the display panel may include a driving backplane, a light-emitting layer and a transparent cover plate, the light-emitting layer is located between the driving backplane and the cover plate, the opening penetrates through the light-emitting layer and extends into the driving backplane, and the cover plate covers the opening. A light-shielding ink layer may be disposed on the cover plate, and the ink layer surrounds the opening for shielding a non-light-emitting region between the light-emitting region and the opening.

Embodiments of the present disclosure provide a display panel. As shown in FIGS. 1-8, the display panel includes a display substrate 1, a cover plate 2, a first protective layer 3, a mounting hole 100 and a light-shielding body 4, wherein:

The display substrate 1 has a display region 101 and a peripheral region 102 located outside the display region 101. The cover plate 2 is disposed on a side of the display substrate 1. The first protective layer 3 is disposed on a side of the display substrate 1 facing away from the cover plate 2 and covers at least the display region 101. The mounting hole 100 extends at least from a surface of the first protective layer 3 facing away from the display substrate 1 to the cover plate 2, facing away from the display substrate 1, and penetrates through at least the first protective layer 3 and the display substrate 1. The mounting hole 100 penetrates through at least part of the display region 101. The light-shielding body 4 is filled in the mounting hole 100, and the light-shielding body 4 is provided with a light-transmitting hole 200 which penetrates through the light-shielding body 4 along an axial direction of the mounting hole 100.

Since the light-transmitting hole 200 is opened in the light-shielding body 4, the display panel according to an embodiment of the present disclosure may receive light by the photoelectric sensing device, so as to form an image. The light-shielding body 4 may block light emitted when the display substrate 1 displays an image, so as to avoid interference with imaging of the photoelectric sensing device, which is beneficial to improvement of the imaging quality. Meanwhile, since the light-shielding body 4 is provided to block the light, it may avoid the interference of light for displaying the image with the photoelectric sensing device by increasing the distance between the light-emitting region and the mounting hole 100, which is beneficial to reducing the spacing between the light-emitting region and the mounting hole 100, so as to enlarge the effective display region 101. Since light may be shielded by the light-shielding body 4, it is beneficial to reducing or even omitting the ink layer disposed on the cover plate, which is beneficial to reducing the thickness.

Each part of the display panel of the present disclosure will be described in detail below:

As shown in FIG. 1, a display substrate 1 is used for emitting light to display an image, and it may have a display region 101 and a peripheral region 102 located outside the display region 101. The display region 101 may emit light, and the peripheral region 102 may not emit light. The peripheral region 102 may be a closed annular region surrounding the display region 101, and may also be an enclosed region partially surrounding the display region 101, and the peripheral region 102 is not particularly limited herein.

The display substrate 1 may be an organic electroluminescent display substrate, and may also be other light-emitting display substrates, the structure thereof is not particularly limited herein. The display substrate 1, exemplified as being the organic electroluminescence display substrate, may include a driving backplane 110 and a light-emitting layer 120. The driving backplane 110 has a driving circuit, and the light-emitting layer 120 has a plurality of light-emitting devices, which may be driven by the driving circuit independently to emit light, so as to display an image. wherein:

The driving circuit may include a pixel circuit and a peripheral circuit. At least a part of the pixel circuit is provided in the display region 101. Certainly, there may be a part of a region of the pixel circuit provided in the peripheral region 102. The pixel circuit may be 7T1C, 7T2C, 6T1C, 6T2C or the like, as long as it can drive the light-emitting device to emit light, and the structure thereof is not particularly limited herein. The number of the pixel circuits is the same as the number of the light-emitting devices, and the pixel circuits are connected to the light-emitting devices in one-to-one correspondence, so as to respectively control the light-emitting devices to emit light independently.

Wherein, nTmC indicates that one pixel circuit includes n transistors (indicated by letter "T") and m capacitors (indicated by letter "C").

The peripheral circuit is located in the peripheral region 102, and the peripheral circuit is connected to the pixel circuit for inputting a driving signal to the pixel circuit, so as to control the light-emitting devices to emit light. The peripheral circuit may include a gate driving circuit and a light-emitting control circuit, and certainly may also include other circuits, and the specific structure of the peripheral circuit is not particularly limited herein.

Figure 2:
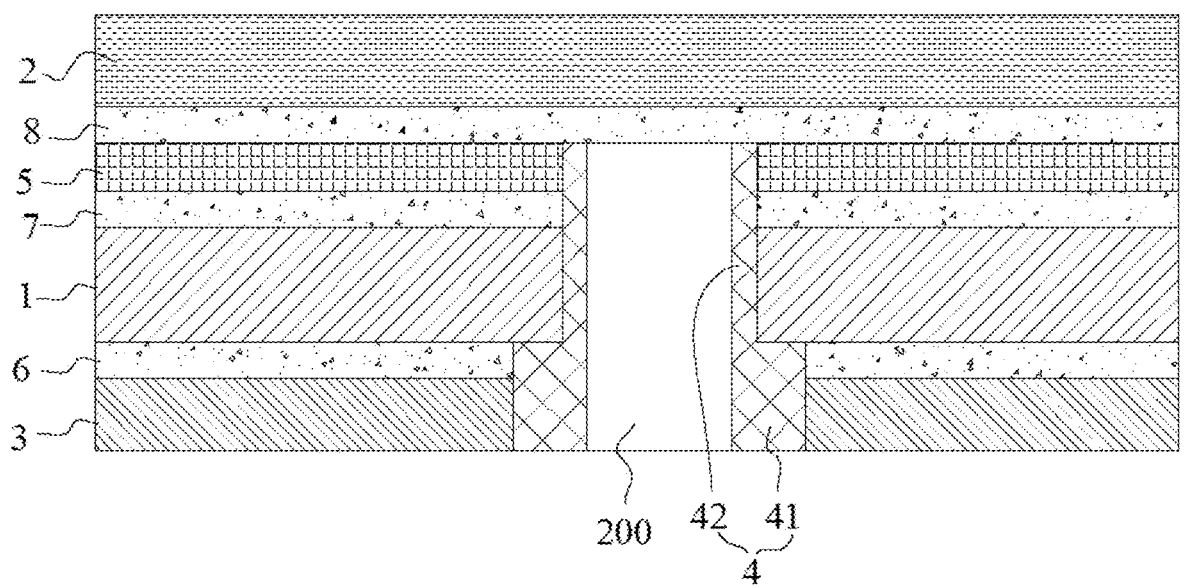
FIG. 2 is a cross-sectional view of a first embodiment of a display panel according to the present disclosure.
Figure 3:
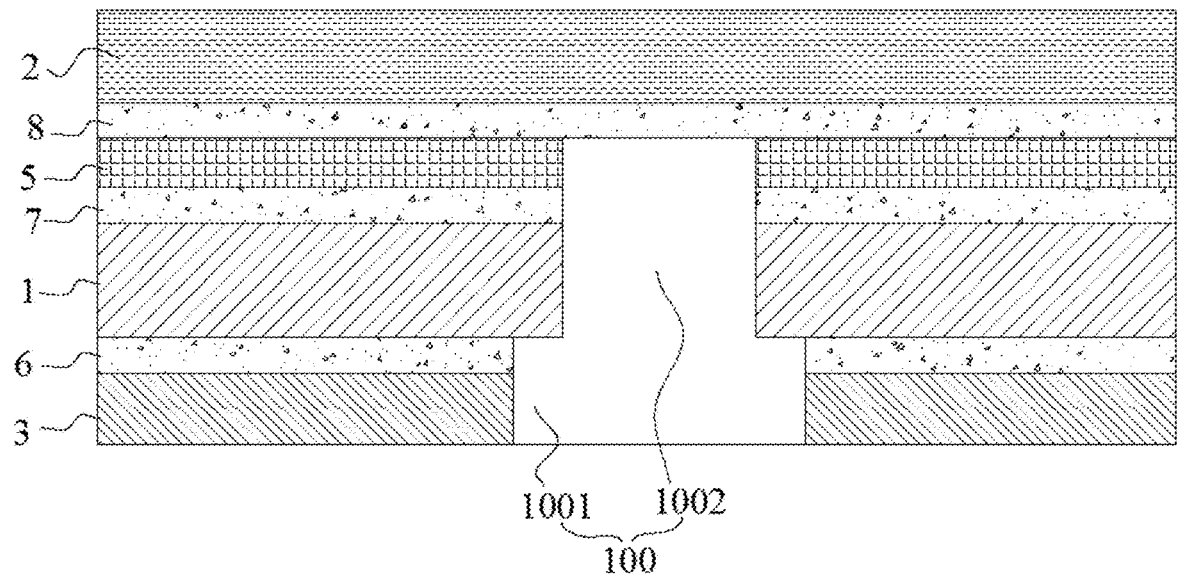
FIG. 3 is a cross-sectional view of a first embodiment of a display panel in which a light-shielding body is not disposed according to the present disclosure.

As shown in FIGS. 2 and 3, a driving backplane 110 may be formed of a plurality of film layers. For example, the driving backplane 110 may include a base substrate and a driving layer disposed on a side of the base substrate, wherein the base substrate may be a single layer or multi-layer structure, and may be a rigid or flexible structure, which is not particularly limited herein. The above-mentioned driving circuit may be located on the driving layer. A transistor in the driving circuit is exemplified as being a top gate thin film transistor, the driving layer may include an active layer, a first gate insulating layer, a gate electrode, a second gate insulating layer, an interlayer dielectric layer, a first source-drain layer, a passivation layer, a first flat layer, a second source-drain layer and a second flat layer.

The active layer is provided on the base substrate. The first gate insulating layer covers the active layer. The gate electrode is disposed on a surface of the first gate insulating layer facing away from the base substrate, and is disposed to face the active layer. The second gate insulating layer covers the gate electrode and the first gate insulating layer. The interlayer dielectric layer covers the second gate insulating layer. The first source-drain layer is disposed on a surface of the interlayer dielectric layer facing away from the base substrate and includes a source electrode and a drain electrode, and the source electrode and the drain electrode are connected to the active layer. The passivation layer covers the first source-drain layer. The first flat layer covers the passivation layer. The second source-drain layer is disposed on a surface of the first flat layer facing away from the base substrate and is connected to the first source-drain layer. The second flat layer covers the second source-drain layer and the first flat layer.

Figure 6:
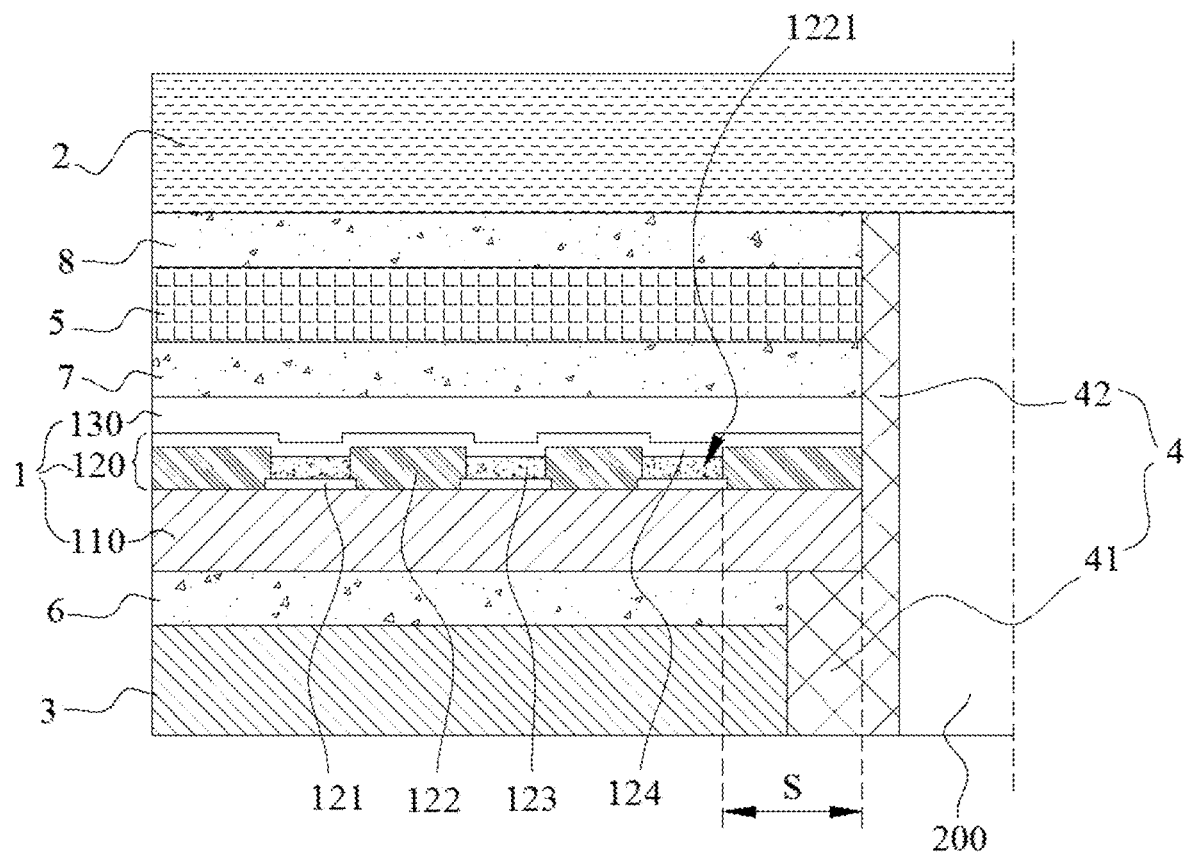
FIG. 6 is a partial cross-sectional view of a second embodiment of a display panel according to the present disclosure.

As shown in FIG. 6, a light-emitting layer 120 is disposed on a side of a driving backplane 110, for example, the light-emitting layer 120 is disposed on a surface of the driving layer facing away from the base substrate. The light-emitting layer 120 may include a plurality of light-emitting devices arranged in a display region 101 in an array and a pixel defining layer 122, wherein:

The pixel defining layer 122 may be disposed on a side of the driving backplane 110, for example, the pixel defining layer 122 may be disposed on a surface of the second flat layer facing away from the base substrate. The pixel defining layer 122 is used for separating the respective light-emitting devices. Specifically, the pixel defining layer 122 may be provided with a plurality of openings 1221, and the range defined by each of the openings 1221 is the range of a light-emitting device. The shape of the opening 1221, i.e., the shape of the profile of the orthographic projection of the opening 1221 on the driving backplane 110 may be a polygonal shape, a smooth closed curve or other shapes, and the smooth closed curve may be a circular shape, an elliptical shape or a waist circular shape, etc., which is not particularly limited herein.

The light-emitting devices may be connected to the pixel circuits in one-to-one correspondence, so as to emit light under the driving of the driving circuit. For example, the light-emitting device may be connected to the second source-drain layer, and may emit light under the driving of the driving circuit. The light-emitting device may be an Organic Light-Emitting Diode (OLED), and the light-emitting device may include a first electrode 121, a light-emitting functional layer 123, and a second electrode 124 stacked in sequence along a direction away from the driving backplane 110, wherein:

The first electrode 121 and the pixel defining layer 122 may be disposed on the same surface of the driving backplane 110, the first electrode 121 may be used as an anode of the light-emitting device. The openings 1221 of the pixel defining layer 122 expose the first electrodes 121 in one-to-one correspondence. The first electrode 121 may be a single-layer or multi-layer structure, and its material may include one or more of conductive metal, metal oxide and alloy.

The light-emitting functional layer 123 is at least partially disposed in the opening 1221, and may include a hole injection layer, a hole transport layer, a light-emitting material layer, an electron transport layer and an electron injection layer stacked in sequence in the direction away from the driving backplane 110. A hole and an electron may be recombined into an exciton on the light-emitting material layer, and the exciton radiates a photon, so as to generate visible light. The specific light-emitting principle will not be described in detail herein.

Furthermore, as shown in FIGS. 2 and 3, the light-emitting functional layers 123 of the light-emitting devices may be independent of each other and distributed in the openings 1221 in an array, that is, the light-emitting functional layers 123 of different light-emitting devices are independent of each other.

Certainly, the light-emitting functional layers 123 of the light-emitting devices may also share at least a part of the film layer of the light-emitting functional layers 123, so as to reduce the difficulty of the process.

The light-emitting devices may emit light of the same color, and at this time, it also needs the light filtering of a color filter layer to realize color display. Certainly, since the light-emitting material layers of the light-emitting devices are independent of each other, different light-emitting devices may also directly emit light of different colors.

The second electrode 124 may cover the light-emitting functional layer 123, and it may be used as a cathode of the light-emitting device. The second electrode 124 may be a single-layer or multi-layer structure, and its material may include one or more of conductive metal, metal oxide, and alloy.

Furthermore, as shown in FIG. 6, the light-emitting devices may share the same second electrode 124. Specifically, the second electrode 124 is a continuous conductive layer covering the light-emitting functional layers 123 of the light-emitting devices and the pixel defining layer 122. That is, the orthographic projection of the second electrode 124 on the pixel defining layer 122 covers the openings 1221.

In addition, the display substrate 1 may further include an encapsulation layer 130, wherein:

The encapsulation layer 130 covers a surface of the light-emitting layer 120 facing away from the driving backplane 110, and it may be used to protect the light-emitting layer 120 and prevent external moisture and oxygen from eroding the light-emitting devices.

In some embodiments of the present disclosure, the encapsulation may be realized by means of Thin-Film Encapsulation (TFE). Specifically, the encapsulation layer 130 may include a first inorganic layer, an organic layer and a second inorganic layer. Wherein, the first inorganic layer covers a surface of the light emitting layer 120 facing away from the driving backplane 110; the organic layer may be disposed on a surface of the first inorganic layer facing away from the driving backplane 110, and a boundary of the organic layer is defined inside of a boundary of the first inorganic layer; and the second inorganic layer covers the organic layer and the first inorganic layer that is not covered by the organic layer. The intrusion of moisture and oxygen may be blocked by the second inorganic layer, and the planarization may be realized by the organic layer having flexibility.

As shown in FIGS. 2-6, the first protective layer 3 may be disposed on the backlight side of the display substrate 1, for example, the first protective layer 3 may be adhered to the backlight side of the display substrate 1 via the first adhesive layer 6. That is, the first adhesive layer 6 is disposed on a surface of the display substrate 1 facing away from the cover plate 2, and the first protective layer 3 is adhered to a surface of the first adhesive layer 6 facing away from the display substrate 1. The first protective layer 3 may cover at least a part of the peripheral region 102 and the display region 101. For example, the first protective layer 3 may be a back film adhered to a surface of the display substrate 1 facing away from the cover plate 1 via the first adhesive layer 6, and it may be a resin material for protecting the display substrate 1.

Figure 7:
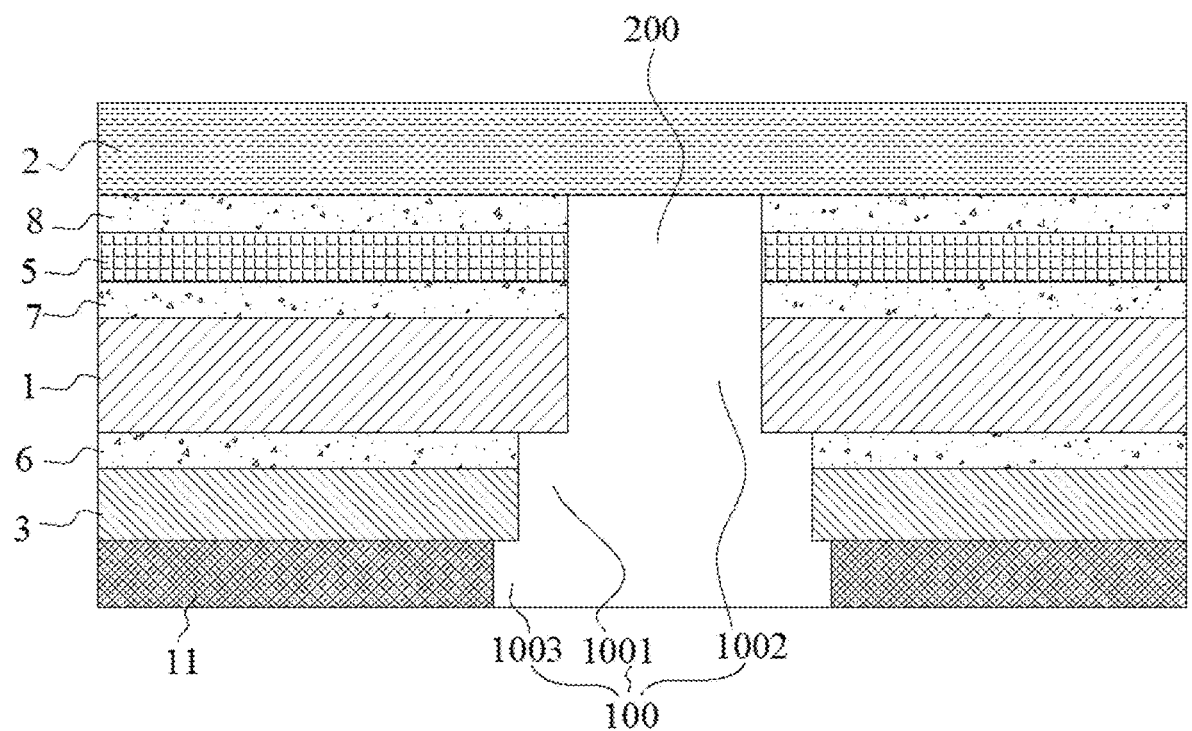
FIG. 7 is a cross-sectional view of a third embodiment of a display panel according to the present disclosure.
Figure 8:
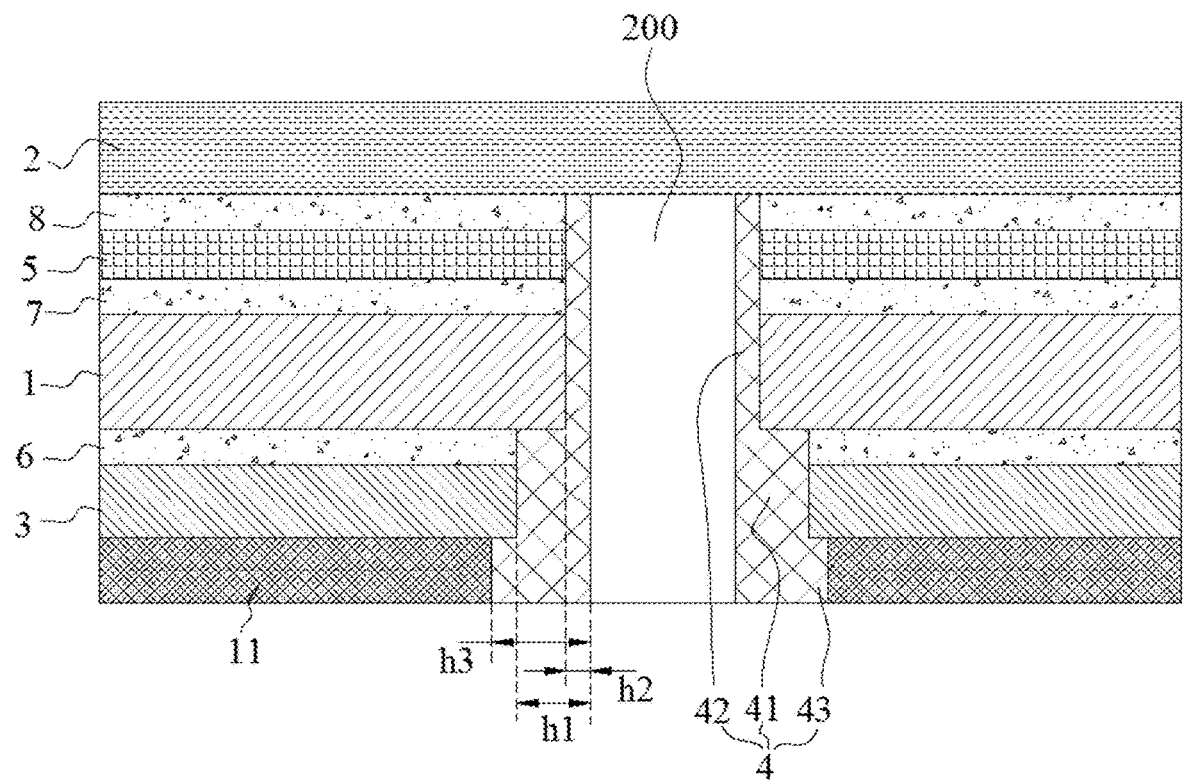
FIG. 8 is a cross-sectional view of a third embodiment of a display panel in which a light-shielding body is not disposed according to the present disclosure.

In addition, in some embodiments of the present disclosure, as shown in FIGS. 7 and 8, the display panel may further include a second protective layer 11, and it may be disposed on a side of the first protective layer 3 facing away from the display substrate 1. The second protective layer 11 may include a buffer layer and a heat dissipation layer, wherein:

The buffer layer may be adhered to a surface of the first protective layer 3 facing away from the display substrate 1 via a glue layer. The glue layer may be grid glue (EMBO), which is conducive to air exhausting while realizing adhering, and if the display substrate 1 is a flexible display module, the grid glue may adapt to the bending of the display substrate 1. The buffer layer may be foam or other flexible materials, so as to perform the function of buffering for the display substrate 1 and also perform the function of light-shielding.

The heat dissipation layer may be disposed on a side of the buffer layer facing away from the display substrate 1, and its material may be metal, such as copper, etc., so as to conduct heat and dissipate heat for the display substrate 1.

In addition, the second protective layer 11 may further include a reinforcement layer, which may be disposed on a side of the buffer layer facing away from the display substrate 1, and the reinforcement layer may be used to improve the strength of the second protective layer 11 so that it is not easily broken or damaged. The material of the reinforcement layer may be polyimide or other flexible materials, but if the display substrate 1 is a flexible display substrate 1, the reinforcement layer should be a flexible material so that the display substrate 1 may be bent. The above-mentioned heat dissipation layer may be disposed on a surface of the reinforcement layer facing away from the display substrate 1.

Before disposing the second protective layer 11 on a side of the display substrate 1, the second protective layer 11 may be formed in advance. That is, film layers of the second protective layer 11 are formed, and then the second protective layer 11 formed in advance is adhered to the display substrate 1. Certainly, the film layers of the second protective layer 11 may also be sequentially formed on a side of the display substrate 1.

As shown in FIGS. 2-8, the cover plate 2 may be disposed on the light-outgoing side of the display substrate 1 by adhering or other means, for example, disposed on a side of the touch layer facing away from the driving backplane 110. Meanwhile, the cover plate 2 may cover the display region 101 and the peripheral region 102, and a boundary of the cover plate 2 may extend beyond a boundary of the peripheral region 102. The cover plate 2 may be made of glass or other transparent materials to protect the display substrate 1 and transmit light emitted from the light-emitting device.

In addition, the display panel of the present disclosure may further include an intermediate functional layer 5, which may be disposed on a side of the display substrate 1 close to the cover plate 2, that is, the intermediate functional layer 5 is located between the display substrate 1 and the cover plate 2. The intermediate functional layer 5 may include a polarizer, which may be used to filter out light in most wavelength bands entering the display substrate 1 from the outside, to achieve the effect of reducing reflection without completely blocking the light emitted from the light-emitting device, so as to display images normally. The polarizer may be a circular intermediate functional layer 5 for generating circular polarized light.

In addition, the intermediate functional layer 5 may further include a touch layer, which may be used for sensing a touch operation of a user, so as to interact with the user via an image displayed by the display panel. The polarizer may be disposed on a side of the touch layer facing away from the display substrate 1, or, the touch layer may be disposed on a side of the polarizer facing away from the display substrate 1.

In some embodiments of the present disclosure, the touch layer, which is exemplified as being mutual capacitance touch, may include a first touch electrode and a second touch electrode, and the first touch electrode and the second touch electrode may be crossing and distributed in space in a first direction and a second direction that are perpendicular to each other, so as to determine a touch position by sensing a change in capacitance between the first touch electrode and the second touch electrode.

In some embodiments of the present disclosure, as shown in FIGS. 2-8, the intermediate functional layer 5 may be disposed on a surface of the display substrate 1 close to the cover plate 2 by means of adhesion. Specifically, the display panel may further include a second adhesive layer 7, which may be adhered to a surface of the display substrate 1 close to the cover plate 2. For example, the second adhesive layer 7 is adhered to a surface of the display substrate 1 facing away from the first protective layer 3. The intermediate functional layer 5 is adhered to a surface of the second adhesive layer 7 facing away from the first protective layer 3.

Meanwhile, as shown in FIGS. 2-8, the display panel may further include a third adhesive layer 8, which may be adhered to a surface of the intermediate functional layer 5 facing away from the display substrate 1. The cover plate 2 may be adhered to a surface of the third adhesive layer 8 facing away from the display substrate 1.

As shown in FIGS. 2-8, based on the display substrate 1 of any of the above-mentioned embodiments, a mounting hole 100 may be opened in the display region 101 of the display substrate 1, so as to conveniently generate an image by the photoelectric sensing device. A boundary of the mounting hole 100 may be located within the boundary of the display region 101, or may partially overlap with the boundary of the display region 101. Meanwhile, the light-shielding body 4 may be filled in the mounting hole 100, and it may be attached to a sidewall of the mounting hole 100, and the light-shielding body 4 may be made of a light-shielding material. For example, the material of the light-shielding body 4 may be black acrylic, epoxy resin or rubber, etc., which is not particularly limited here, as long as it can shield light. When forming the light-shielding body 4, the light-shielding body 4 may be obtained by first filling the light-shielding material into the mounting hole 100, and then curing the light-shielding material.

At the same time, as shown in FIGS. 2-8, in order to facilitate the photoelectric sensing device to receive light, a light-transmitting hole 200 may be opened in the light-shielding body 4, and the light-transmitting hole 200 may penetrate through the light-shielding body 4 in the axial direction of the mounting hole 100, so as to transmit light and block the light emitted by the light-emitting device from directly entering the light-transmitting hole 200. In addition, the mounting hole 100 and the light-transmitting hole 200 may be round holes, square holes, elliptical holes, etc., and the shapes thereof are not particularly limited herein.

The contact area between the light-shielding body 4 and the mounting hole 100 may be increased, so as to prevent the light-shielding body 4 from falling off. For example, the mounting hole 100 may be a stepped hole, and the light-shielding body 4 may be attached to an inner wall of the stepped hole.

In some embodiments of the present disclosure, the mounting hole 100 may include a first hole segment 1001 and a second hole segment 1002 arranged in a direction close to the cover plate 2. The first hole segment 1001 penetrates through the first protective layer 3, and the second hole segment 1002 penetrates through the display substrate 1. A sidewall of the first hole segment 1001 surrounds outside the second hole segment 1002, that is, a projection of the sidewall of the first hole segment 1001 on the display substrate 1 surrounds outside a boundary of the second hole segment 1002, so that the second hole segment 1002 is located in a local region at a bottom surface of the first hole segment 1001. Correspondingly, the light-shielding body 4 may include a first light-shielding portion 41 and a second light-shielding portion 42 arranged in a direction close to the cover plate 2. The first light-shielding portion 41 is filled in the first hole segment 1001, and the second light-shielding portion 42 is filled in the second hole segment 1002. The first light-shielding portion 41 and the second light-shielding portion 42 are an integral structure, the second light-shielding portion 42 is attached to the sidewall of the second hole segment 1002, and the first light-shielding portion 41 is not only attached to the sidewall of the first hole segment 1001, and also is attached to a region of the bottom surface of the first hole segment 1001 where the second hole segment 1002 is not provided, which is beneficial to increasing a contact area between the light-shielding body 4 and the mounting hole 100 and prevents the light-shielding body 4 from falling off.

In addition, as shown in FIGS. 7 and 8, in some embodiments of the present disclosure, the mounting hole 100 further includes a third hole segment 1003 penetrating through the second protective layer 11, and the sidewall of the third hole segment 1003 surrounds outside the first hole segment 1001. That is, a projection of the sidewall of the third hole segment 1003 on the display substrate 1 surrounds outside the boundary of the first hole segment 1001, so that the first hole segment 1001 is located in a local region of a bottom surface of the third hole segment 1003. Correspondingly, the light-shielding body 4 further includes a third light-shielding portion 43, and the third light-shielding portion 43 is filled in the third hole segment 1003.

The third light-shielding portion 43 together with the first light-shielding portion 41 and the second light-shielding portion 42 may be an integral structure, the second light-shielding portion 42 is attached to the sidewall of the second hole segment 1002, the third light-shielding portion 43 is not only attached to the sidewall of the third hole segment 1003, but also is attached to a region of the bottom surface of the third hole segment 1003 where the first hole segment 1001 is not provided, which may further increase the contact area between the light-shielding body 4 and the mounting hole 100 and prevent the light-shielding body 4 from falling off.

Certainly, in other embodiments of the present disclosure, the sidewall of the mounting hole 100 may also made uneven and attached to the light-shielding body 4, so as to increase the contact area between the light-shielding body 4 and the mounting hole 100.

In addition, the light-transmitting hole 200 penetrates through the first light-shielding portion 41, the second light-shielding portion 42 and the third light-shielding portion 43, and the light-transmitting hole 200 may be a straight hole. That is, the orthographic projection of the sidewall of the light-transmitting hole 200 located in the region of the first light-shielding portion 41 and the orthographic projection of the sidewall of the light-transmitting hole 200 located in the region of the second light-shielding portion 42 on the cover plate 2 overlap, and the orthographic projection of the sidewall of the light-transmitting hole 200 located in the region of the third light-shielding portion 43 and the orthographic projection of the sidewall of the light-transmitting hole 200 located in the region of the first light-shielding portion 41 on the cover plate 2 overlap.

Furthermore, in order to ensure that the light-shielding body 4 may shield light without blocking the photoelectric sensing device, the distance between the sidewall of the light-transmitting hole 200 and the sidewall of the mounting hole 100 may be limited. That is, the thickness of the light-shielding body 4 in the radial direction of the mounting hole 100 is limited. The sidewall of the mounting hole 100 and the sidewall of the light-transmitting hole 200 refer to inner surfaces thereof extending in the axial direction, and do not include inner surface extending in the radial direction. For example, the distance between the sidewall of the light-transmitting hole 200 and the sidewall of the mounting hole 100 is not less than 1 μm, so as to avoid light transmission due to the thickness of the light-shielding body 4 on the sidewall of the mounting hole 100 being too thin; and the distance between the sidewall of the light-transmitting hole 200 and the sidewall of the mounting hole 100 is not greater than 500 μm, so as to avoid narrowing a light-transmitting region and blocking the photoelectric sensing device.

It should be noted that, as shown in FIG. 6, if sizes of the first hole segment 1001, the second hole segment 1002 and the third hole segment 1003 are different, the distance h1 between the sidewall of the first hole segment 1001 and the sidewall of the light-transmitting hole 200 is not less than 1 μm and not more than 500 μm. The distance h2 between the sidewall of the second hole segment 1002 and the sidewall of the light-transmitting hole 200 is not less than 1 μm and not more than 500 μm. The distance h3 between the sidewall of the third hole segment 1003 and the sidewall of the light-transmitting hole 200 is not less than 1 μm and not more than 500 μm.

As shown in FIG. 6, although light emitted from the light-emitting device may be blocked by the light-shielding body 4, the spacing between the light-emitting device and the mounting hole 100 may be limited, so as to prevent the light emitted from the light-emitting device from directly entering the light-transmitting hole 200 to the greatest extent. For example, there is a certain distance between any of the light-emitting devices and the region where the sidewall of the mounting hole 100 is located in the light-emitting layer 120, that is, alternatively disposed. A maximum value of a distance S between the light-emitting device closest to the region of the light-emitting layer 120 where the sidewall of the mounting hole 100 is located and the region of the light-emitting layer 120 where the sidewall of the mounting hole 100 is located is 0.3 mm, for example, 0.1 mm, 0.2 mm or 0.3 mm. Obviously, the distance between the light-emitting device and the mounting hole 100 may be less than 0.5 mm, due to the light-shielding effect of the light-shielding body 4. Without increasing the size of the display panel, more light-emitting devices may be disposed to expand the region of the effective display region 101.

The distance between the light-emitting device and the sidewall of the mounting hole 100 defines a minimum distance between the sidewall of the opening 1221 of the pixel defining layer 122 of the light-emitting device and the sidewall of the mounting hole 100.

Depths of the mounting hole 100 and the light-transmitting hole 200 are described below:

As shown in FIGS. 2-8, the depths of the mounting hole 100 and the light-transmitting hole 200 are the same, that is, lengths thereof in the axial direction are the same. The mounting hole 100 and the light-transmitting hole 200 may extend to the cover plate 2 from the second protective layer 3, and penetrates through at least the second protective layer 11, the first protective layer 3, the display substrate 1, the first adhesive layer 6, the second adhesive layer 7 and the intermediate functional layer 5, but does not penetrate through the cover plate 2.

In the first embodiment of the present disclosure, as shown in FIGS. 2 and 3, the mounting hole 100 and the light-transmitting hole 200 expose the third adhesive layer 8, that is, the mounting hole 100 and the light-transmitting hole 200 are blind holes covered by the third adhesive layer 8 and do not penetrate through the third adhesive layer 8.

Figure 4:
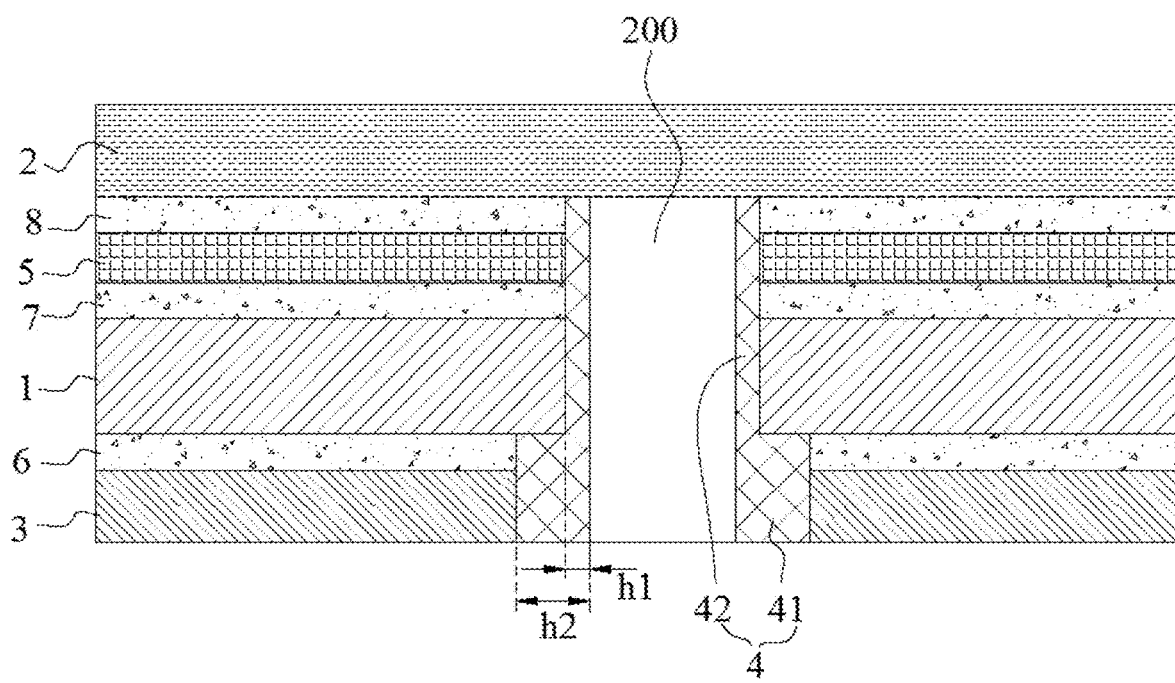
FIG. 4 is a cross-sectional view of a second embodiment of a display panel according to the present disclosure.
Figure 5:
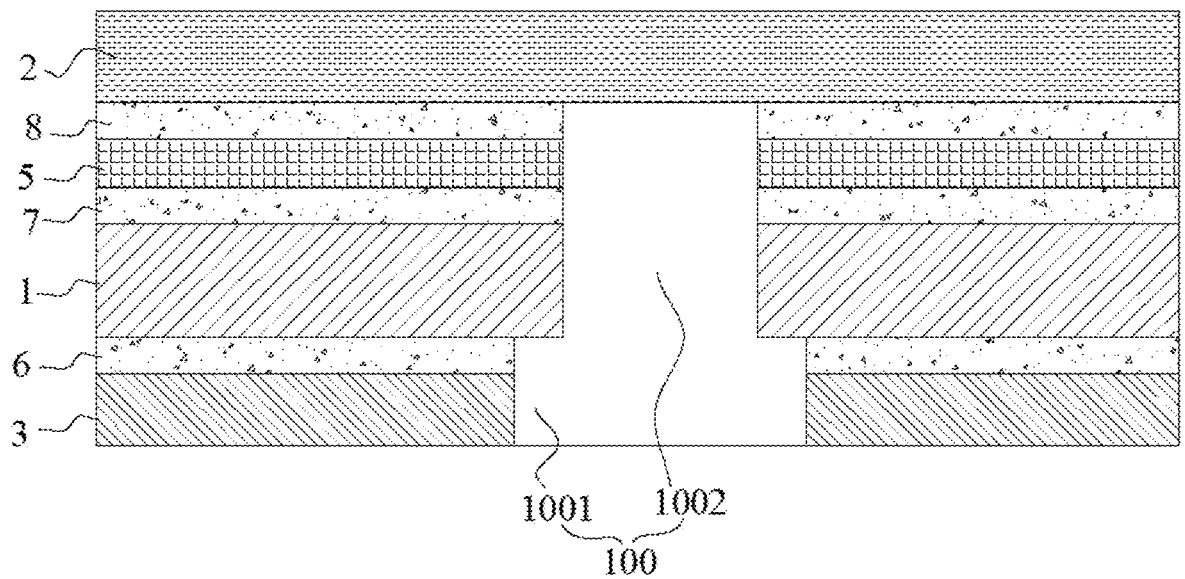
FIG. 5 is a cross-sectional view of a second embodiment of a display panel in which a light-shielding body is not disposed according to the present disclosure.

In the second embodiment of the present disclosure, as shown in FIGS. 4-6, the mounting hole 100 and the light-transmitting hole 200 penetrate through the third adhesive layer 8 and expose the cover plate 2, that is, the mounting hole 100 and the light-transmitting hole 200 are blind holes covered by the cover plate 2, but pass through the third adhesive layer 8.

Embodiments of the present disclosure provide a method for manufacturing a display panel. The display panel may be the display panel of any of the above-mentioned embodiments, and the specific structure thereof will not be described in detail herein. The manufacturing method will be exemplarily described below in conjunction with the first and second embodiments of the display panel:

In the first manufacturing method, a display panel is the display panel in the above-mentioned first embodiment, as shown in FIGS. 2, 3, and 9-13, the first manufacturing method may include steps S110-S220, wherein:

In step S110, a display substrate 1 having a display region 101 and a peripheral region 102 is formed, and the peripheral region 102 is located outside the display region 101.

In step S120, a first protective layer 3 having a first hole segment 1001 is formed; and a first adhesive layer 6 is formed on a side of the first protective layer 3, and the first hole segment 1001 is exposed by the first adhesive layer 6.

In some embodiments of the present disclosure, the first protective layer 3 may be formed first, and then the first adhesive layer 6 may be formed on a side of the first protective layer 3, and next an opening penetrating through the first protective layer 3 and the first adhesive layer 6 may be formed. A part of the opening located in the first protective layer 3 is the first hole segment 1001.

In other embodiments of the present disclosure, the first protective layer 3 may be formed first, and then the first hole segment 1001 may be opened, and next the first adhesive layer 6 may be formed on a side of the first protective layer 3, and the first adhesive layer 6 can be formed, and the first adhesive layer 6 is hollowed out in the region facing to the first hole segment 1001, so as to expose the first hole segment 1001.

In step S130, an intermediate functional layer 5 adhered with a release layer 9 is formed.

The release layer 9 may be used to protect the intermediate functional layer 5, and it may be a release paper, which will not damage the intermediate functional layer 5 when it is peeled off from the intermediate functional layer 5.

Figure 9:
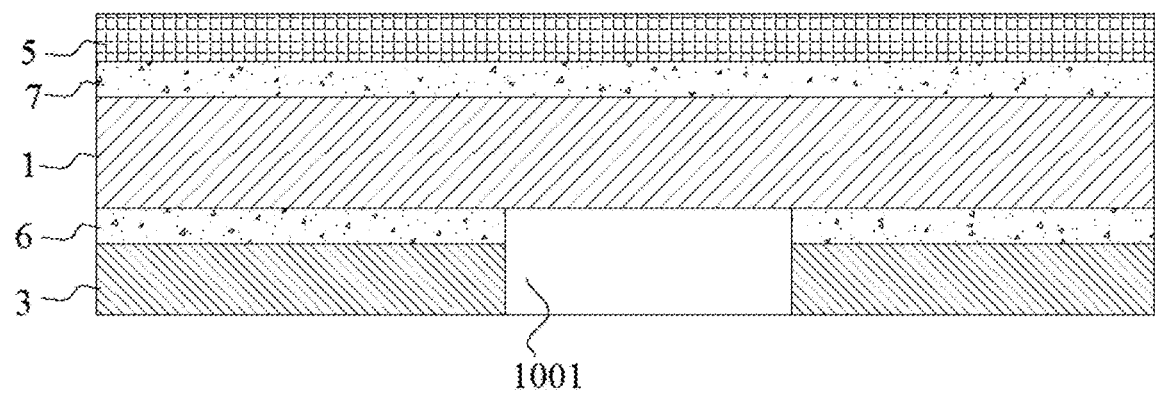
FIGS. 9-13 are cross-sectional views corresponding to some steps in a first manufacturing method according to the present disclosure.
Figure 10:
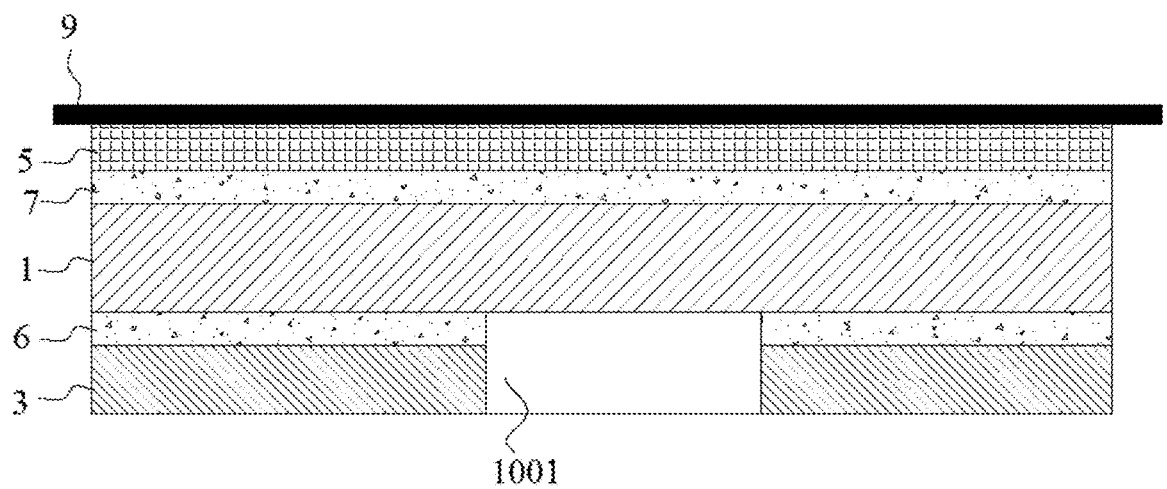
Figure 11:
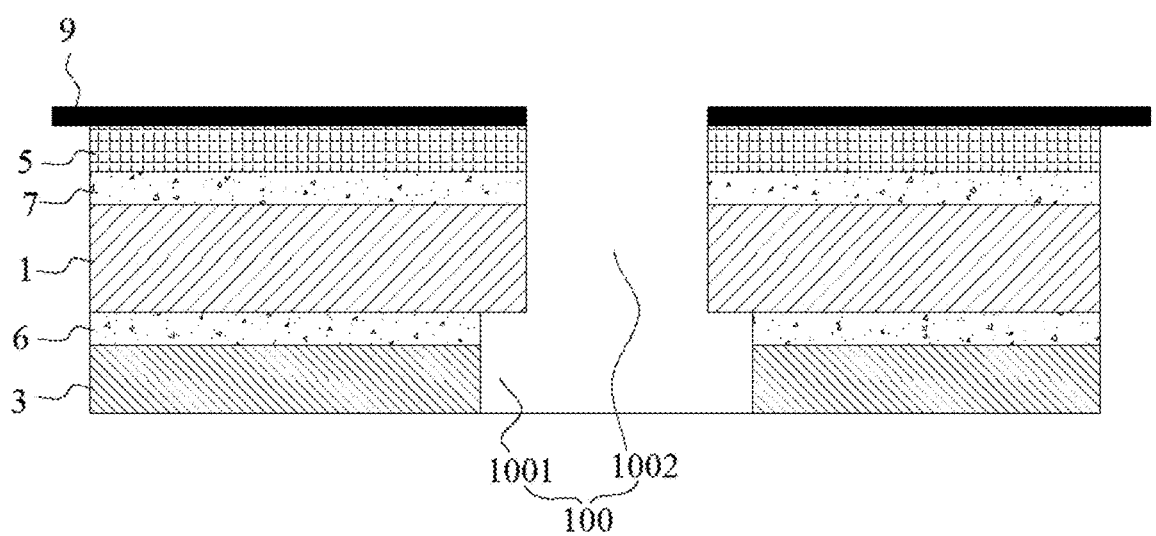

In step S140, the first protective layer 3 is adhered to a side of the display substrate 1 by the first adhesive layer 6, and the first hole segment 1001 exposes a part of the region of the display substrate 1. As shown in FIG. 9, In step S150, the intermediate functional layer 5 is adhered on a surface of the display substrate 1 facing away from the first protective layer 3 via a second adhesive layer; the release layer 9 is located on a surface of the intermediate functional layer 5 facing away from the display substrate 1. As shown in FIG. 10, In step S160, a second hole segment 1002 in communication with the first hole segment 1001 is opened in the display substrate 1 along the first hole segment 1001, so as to form a mounting hole 100, and the second hole segment 1002 penetrates through the release layer 9. As shown in FIG. 11.

When opening the second hole segment, a laser cutting process may be used. During the process, the alignment reference may be provided for a laser cutting apparatus via an alignment mark provided on the intermediate functional layer 5 or the display substrate 1, and the alignment mark may be in the shape of a cross-shape, an L-shape, etc., which is not particularly limited herein. Meanwhile, in order to avoid blocking light emission, the alignment mark may be disposed in the peripheral region 102 of the display substrate 1 or the region of the intermediate functional layer 5 corresponding to the peripheral region 102.

In step S170, the release layer 9 is removed.

In step S180, a support layer 10 is formed on a surface of the intermediate functional layer 5 facing away from the display substrate 1, and the second hole segment 1002 exposes the support layer 10.

The material of the support layer 10 may be an adhesive, and the specific material is not particularly limited herein. Liquid adhesive may be applied to a surface of the second adhesive layer 7 facing away from the display substrate 1 and leveled to form the flat support layer 10 to support the light-shielding body 4 in the subsequent process.

Figure 12:
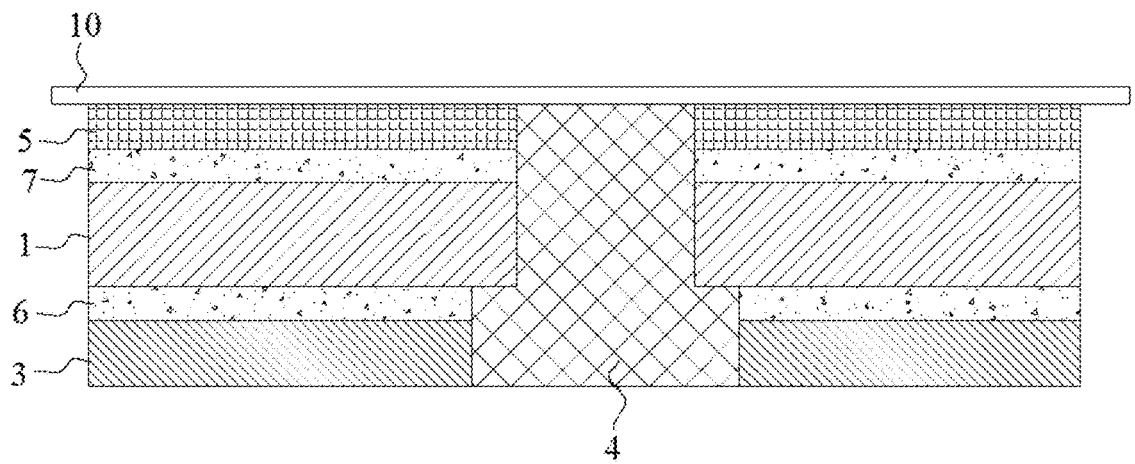

In step S190, the light-shielding body 4 in contact with the support layer 10 is filled in the mounting hole 100. As shown in FIG. 12, For example, the light-shielding material may be filled in the mounting hole 100, and then the light-shielding material is cured to obtain the light-shielding body 4.

Figure 13:
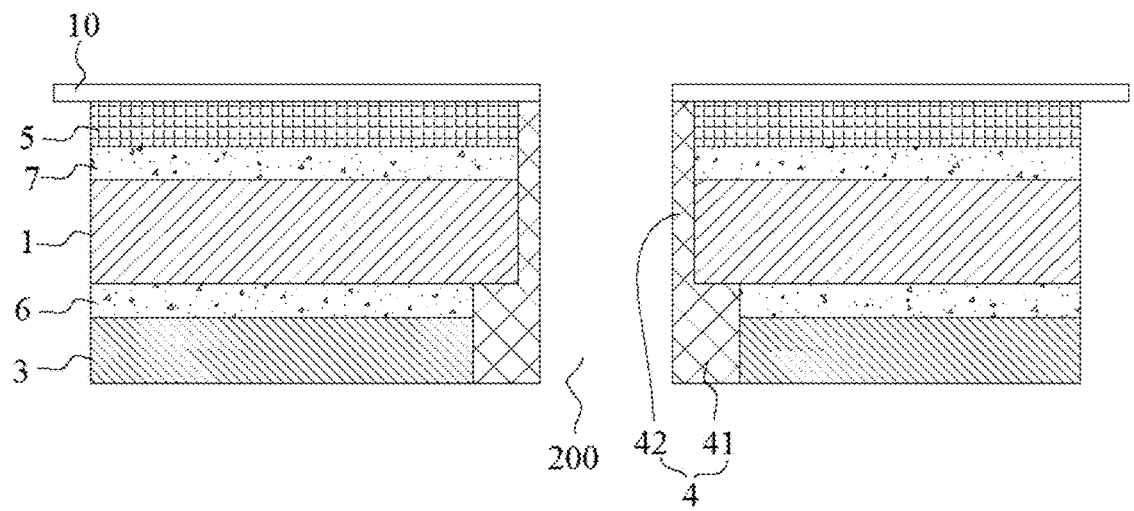

In step S200, a light-transmitting hole 200 is opened in the light-shielding body 4 to form a first light-shielding portion 41 and a second light-shielding portion 42 arranged in a direction close to the support layer 10, and the first light-shielding portion 41 is filled in the first hole segment 1001, and the second light-shielding portion 42 is filled in the second hole segment 1002; the light-transmitting hole 200 penetrates through the first light-shielding portion 41, the second light-shielding portion 42 and the support layer 10. As shown in FIG. 13, In step S210, the support layer 10 is removed.

In step S220, a cover plate 2 is adhered to a surface of the intermediate functional layer 5 facing away from the display substrate 1 via a third adhesive layer 8. As shown in FIG. 2, The third adhesive layer 8 covers the second hole segment 1002.

The specific structures involved in each step of the above-mentioned first manufacturing method have been described in detail in the above embodiments of the display panel, and will not be described in detail herein.

In the second manufacturing method, the display panel is a display panel of the second embodiment of the above-mentioned display panel, as shown in FIGS. 4-6 and 14-18, the manufacturing method may include steps S310-S420, wherein:

In step S310, a display substrate 1 having a display region 101 and a peripheral region 102 is formed, and the peripheral region 102 is located outside the display region 101.

In step S320, a first protective layer 3 having a first hole segment 1001 is formed; and a first adhesive layer 6 is formed on a side of the first protective layer 3, and the first hole segment 1001 is exposed by the first adhesive layer 6.

In step S330, the first protective layer 3 is adhered to a side of the display substrate 1 via the first adhesive layer 6, and the first hole segment 1001 exposes part of the display region 101.

In step S340, an intermediate functional layer 5 is adhered on a surface of the display substrate 1 facing away from the first protective layer 3 via a second adhesive layer.

Figure 14:
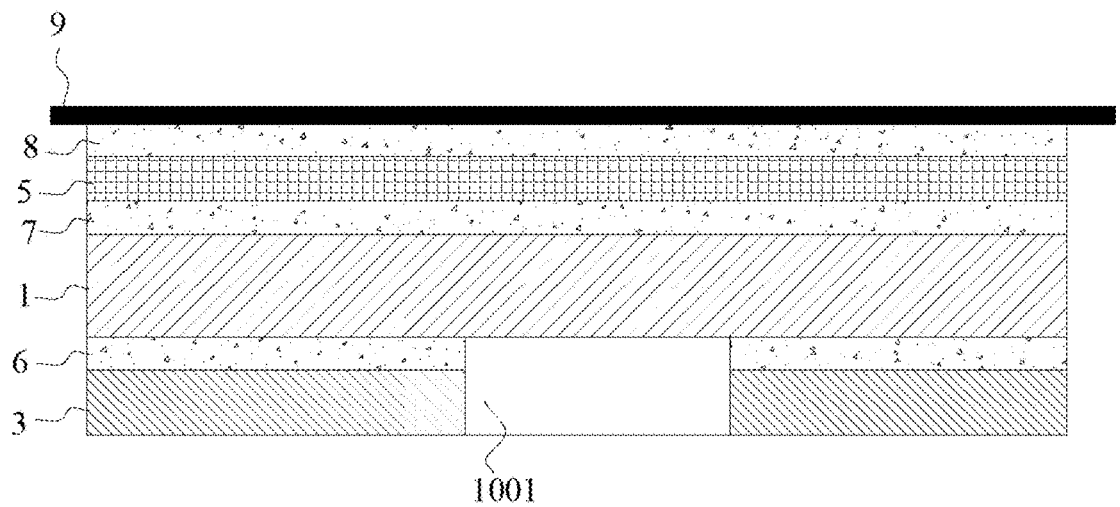
FIGS. 14-18 are cross-sectional views corresponding to some steps in a second manufacturing method according to the present disclosure.

In step S350, a release layer 9 is adhered to a surface of the intermediate functional layer 5 facing away from the display substrate 1 via a third adhesive layer 8. As shown in FIG. 14, In step S360, a second hole segment 1002 in communication with the first hole segment 1001 is opened in the display substrate 1 along the first hole segment 1001, so as to form a mounting hole 100, and the second hole segment 1002 penetrates through the release layer 9.

Figure 15:
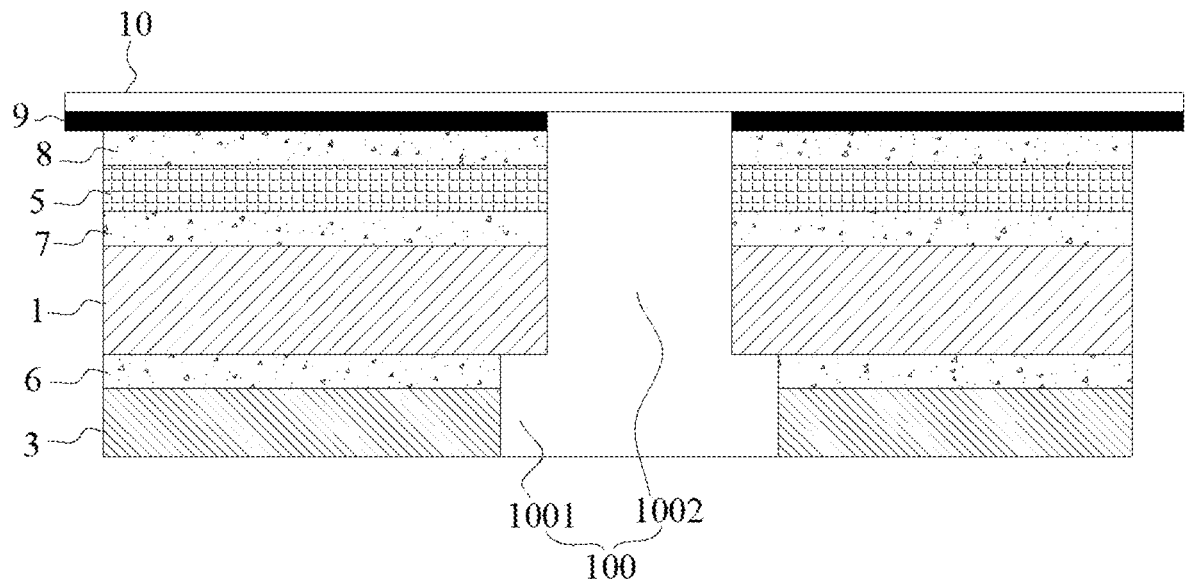
Figure 16:
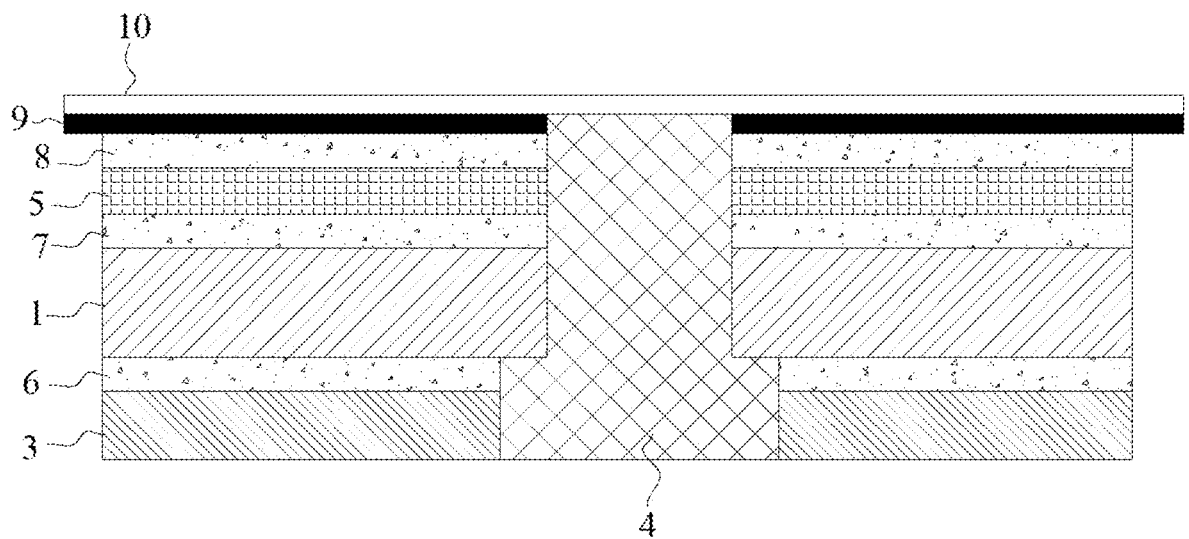
Figure 17:
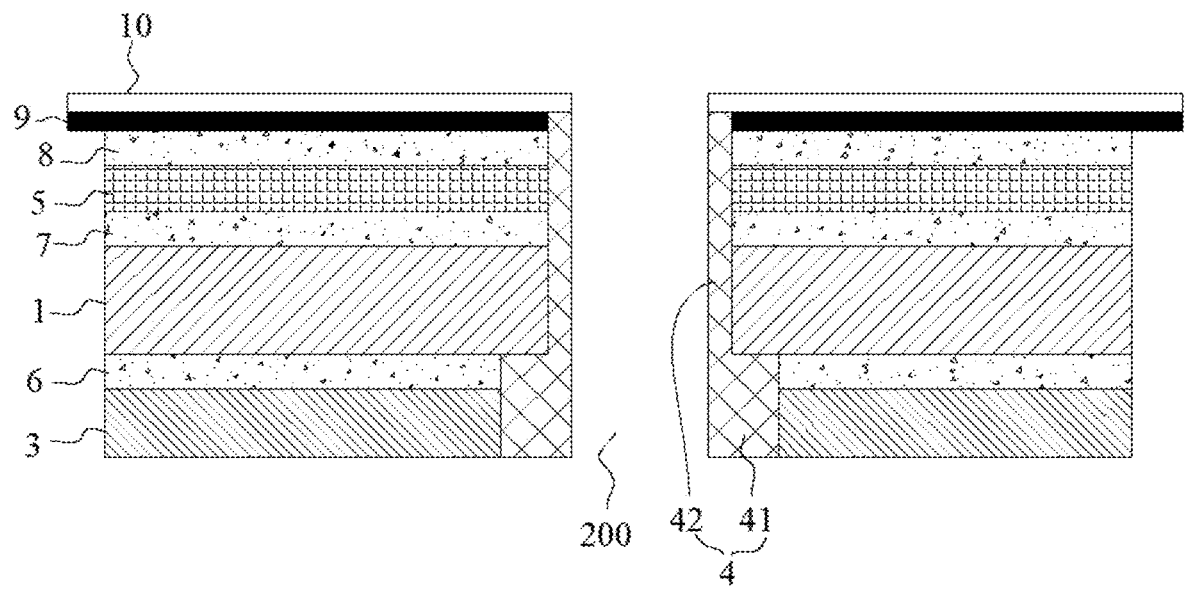
Figure 18:
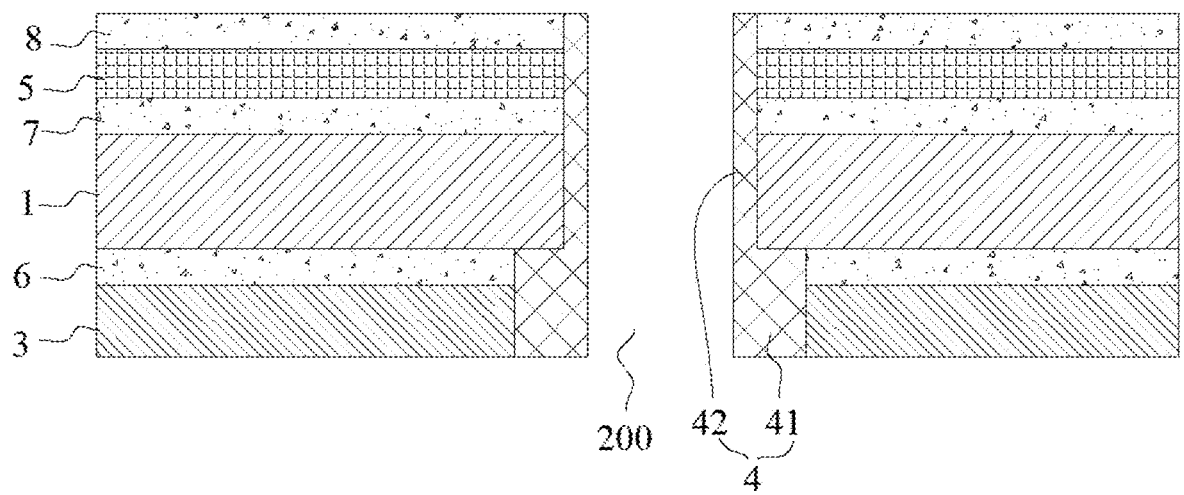

In step S370, a support layer 10 is formed on a surface of the release layer 9 facing away from the display substrate 1, and the second hole segment 1002 exposes the support layer 10. As shown in FIG. 15, In step S380, the light-shielding body 4 in contact with the support layer 10 is filled in the mounting hole 100. As shown in FIG. 16, In step S390, a light-transmitting hole 200 is opened in the light-shielding body 4 to form a first light-shielding portion 41 and a second light-shielding portion 42 arranged in a direction close to the support layer 10, and the first light-shielding portion 41 is filled in the first hole segment 1001, and the second light-shielding portion 42 is filled in the second hole segment 1002; the light-transmitting hole 200 penetrates through the first light-shielding portion 41, the second light-shielding portion 42 and the support layer 10. As shown in FIG. 17, In step S410, the support layer 10 and the release layer 9 are removed. As shown in FIG. 18, In step S420, a cover plate 2 is adhered to a surface of the third adhesive layer 8 facing away from the display substrate 1. As shown in FIG. 4, The specific structures involved in each step of the above-mentioned second manufacturing method have been described in detail in the above embodiments of the display panel. For details, reference may be made to the embodiments of the display panel and the embodiments of the above-mentioned first manufacturing method, which will not be described in detail herein.

It should be noted that although the various steps of the manufacturing method of the present disclosure are described in a specific order in the drawings, this does not require or imply that the steps must be performed in this specific order, or that all of the steps shown must be performed to realize the expected result. Additionally or alternatively, certain steps may be omitted, multiple steps may be combined into one step for execution, and/or one step may be decomposed into multiple steps for execution, and the like.

Embodiments of the present disclosure further provide a display device, which may include the display panel of any of the above-mentioned embodiments. The structure and beneficial effects of the display panel may refer to the above-mentioned embodiments of the display panel, which will not be repeated herein.

Figure 19:
FIG. 19 is a schematic diagram of an embodiment of a terminal apparatus according to the present disclosure.

Embodiments of the present disclosure further provide a terminal apparatus. As shown in FIG. 19, the terminal apparatus may include a display panel 001 and a photoelectric sensing device 002, wherein:

The display panel 001 may be the display panel of any of the above-mentioned embodiments, and its structure and beneficial effects may refer to the display panel and the above-mentioned embodiments of the display panel, which will not be repeated herein.

The photoelectric sensing device 002 may be disposed on a side of the first protective layer 3 away from the cover plate 2 and facing to the light-transmitting hole 200. That is, an orthographic projection of the photoelectric sensing device 002 on the first protective layer 3 at least partially overlaps with the light-transmitting hole 200.

The photoelectric sensing device 002 may be a camera device for capturing images through the light-transmitting region, and it may include a lens and a photoelectric sensor, etc.; alternatively, the photoelectric sensing device 002 may be a sensor for fingerprint identification, and may generate a fingerprint image by receiving light reflected by the fingerprints for fingerprint identification. The specific structure of the photoelectric sensing device 002 is not particularly limited herein, as long as it may receive light through the light-transmitting hole 200.

The terminal apparatus of the present disclosure may be an electronic device with display and shooting functions such as a mobile phone, a tablet computer, a TV, etc., which will not be listed one by one herein.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the art not disclosed by the present disclosure. The specification and embodiments are considered as exemplary only, with the true scope and spirit of the disclosure being indicated by the appended claims.

What is claimed is:

1. A display panel, comprising:
   a display substrate having a display region and a peripheral region located outside the display region;
   a cover plate on a side of the display substrate;
   a first protective layer on a side of the display substrate facing away from the cover plate, and covering at least the display region;
   a mounting hole extending at least from a surface of the first protective layer facing away from the display substrate to the cover plate, and penetrating through at least the first protective layer and the display substrate; wherein the mounting hole penetrates through at least part of the display region; and
   a light-shielding body filled in the mounting hole, and provided with a light-transmitting hole which penetrates through the light-shielding body in an axial direction of the mounting hole.

2. The display panel according to claim 1, wherein the mounting hole comprises a first hole segment and a second hole segment arranged in a direction close to the cover plate, the first hole segment penetrates through the first protective layer, and the second hole segment penetrates through the display substrate; a sidewall of the first hole segment surrounds an outside of the second hole segment;
   wherein the light-shielding body comprises a first light-shielding portion and a second light-shielding portion arranged in a direction close to the cover plate, the first light-shielding portion is filled in the first hole segment, and the second light-shielding portion is filled in the second hole segment; the light-transmitting hole penetrates through the first light-shielding portion and the second light-shielding portion.

3. The display panel according to claim 2, wherein an orthographic projection of a region of the first light-shielding portion where a sidewall of the light-transmitting hole is located and an orthographic projection of a region of the second light-shielding portion where the sidewall of the light-transmitting hole is located on the cover plate are overlapped.

4. The display panel according to claim 1, where a distance between a sidewall of the light-transmitting hole and a sidewall of the mounting hole is not less than 1 μm and not more than 500 μm.

5. The display panel according to claim 1, wherein the display substrate comprises:
   a driving backplane; and
   a light-emitting layer on a side of the driving backplane close to the cover plate; wherein the light-emitting layer comprises a plurality of light-emitting devices located in the display region, and any one of the plurality of light-emitting devices is spaced apart from the mounting hole.

6. The display panel according to claim 5, wherein a distance between the light-emitting device closest to a sidewall of the mounting hole and the sidewall of the mounting hole is more than 0 and not more than 0.3 mm.

7. The display panel according to claim 1, wherein the display substrate further comprises:
   a first adhesive layer adhered to a surface of the display substrate facing away from the cover plate; the first protective layer being adhered to a surface of the first adhesive layer facing away from the display substrate;
   wherein the mounting hole and the light-transmitting hole penetrate through the first adhesive layer.

8. The display panel according to claim 1, wherein the display substrate further comprises:

a second adhesive layer adhered to a surface of the display substrate facing away from the first protective layer; and an intermediate functional layer adhered to a surface of the second adhesive layer facing away from the first protective layer; the intermediate functional layer comprises a polarizer;

wherein the mounting hole and the light-transmitting hole penetrate through the second adhesive layer and the intermediate functional layer.

9. The display panel according to claim 8, wherein the display substrate further comprises:

a third adhesive layer adhered to a surface of the intermediate functional layer facing away from the display substrate;

wherein the cover plate adhered to a surface of the third adhesive layer facing away from the display substrate.

10. The display panel according to claim 9, wherein the mounting hole and the light-transmitting hole penetrate through the third adhesive layer and expose the cover plate.

11. The display panel according to claim 9, wherein both the mounting hole and the light-transmitting hole expose the third adhesive layer.

12. The display panel according to claim 3, wherein both the display substrate further comprises:

a second protective layer on a side of the first protective layer facing away from the display substrate, and comprising a buffer layer and a heat dissipation layer arranged in a direction facing away from the display substrate;

wherein the mounting hole further comprises a third hole segment penetrating through the second protective layer, and a sidewall of the third hole segment surrounds an outside of the first hole segment;

wherein the light-shielding body further comprises a third light-shielding portion, wherein the third light-shielding portion is filled in the third hole segment, and the light-transmitting hole penetrates through the third light-shielding portion; an orthographic projection of a region of the third light-shielding portion where a sidewall of the light-transmitting hole is located and an orthographic projection of a region of the first light-shielding portion where the sidewall of the light-transmitting hole is located on the cover plate are overlapped.

13. A manufacturing method of a display panel, comprising:

forming a display substrate having a display region and a peripheral region, and the peripheral region being located outside the display region;

forming a first protective layer having a first hole segment; forming a first adhesive layer on a side of the first protective layer, and the first adhesive layer exposing the first hole segment;

forming an intermediate functional layer adhered with a release layer;

adhering a first protective layer on a side surface of the display substrate by the first adhesive layer; the first hole segment exposing part of the display region;

adhering an intermediate functional layer to a surface of the display substrate facing away from the first protective layer by a second adhesive layer; the release layer located on a surface of the intermediate functional layer facing away from the display substrate;

providing a second hole segment in communication with the first hole segment in the display substrate along the first hole segment to form a mounting hole, and the second hole segment penetrating through the release layer;

removing the release layer;

forming a support layer on a surface of the intermediate functional layer facing away from the display substrate, and the second hole segment exposing the support layer;

filling a light-shielding body in contact with the support layer in the mounting hole;

providing a light-transmitting hole in the light-shielding body to form a first light-shielding portion and a second light-shielding portion arranged in a direction close to the support layer, the first light-shielding portion being filled in the first hole segment, and the second light-shielding portion being filled in the second hole segment; the light-transmitting hole penetrating through the first light-shielding portion, the second light-shielding portion and the support layer;

removing the support layer; and adhering a cover plate to a surface of the intermediate functional layer facing away from the display substrate via a third adhesive layer.

14. A manufacturing method of a display panel, comprising:

forming a display substrate having a display region and a peripheral region, and the peripheral region being located outside the display region;

forming a first protective layer having a first hole segment; forming a first adhesive layer on a side of the first protective layer, and the first adhesive layer exposing the first hole segment;

adhering a first protective layer to a side surface of the display substrate via the first adhesive layer; the first hole segment exposing part of the display region;

adhering an intermediate functional layer to a surface of the display substrate facing away from the first protective layer via a second adhesive layer;

adhering a release layer to a surface of the intermediate functional layer facing away from the display substrate via a third adhesive layer;

providing a second hole segment in communication with the first hole segment in the display substrate along the first hole segment to form a mounting hole, and the second hole segment penetrating through the release layer;

forming a support layer on a surface of the release layer facing away from the display substrate, and the second hole segment exposing the support layer;

filling a light-shielding body in contact with the support layer in the mounting hole;

providing a light-transmitting hole in the light-shielding body to form a first light-shielding portion and a second light-shielding portion arranged in a direction close to the support layer, the first light-shielding portion being filled in the first hole segment, and the second light-shielding portion being filled in the second hole segment; the light-transmitting hole penetrating through the first light-shielding portion, the second light-shielding portion and the support layer;

removing the support layer and the release layer; and adhering a cover plate to a surface of the third adhesive layer facing away from the display substrate.

15. A terminal apparatus, comprising:

a display panel according to claim 1;

a photoelectric sensing device on a side of the first protective layer facing away from the cover plate, facing to a light-transmitting hole, and configured to receive a light passing through the light-transmitting hole.

\* \* \* \* \*